United States Patent
Ching et al.

(10) Patent No.: US 9,882,032 B2
(45) Date of Patent: Jan. 30, 2018

(54) STRUCTURE AND METHOD FOR FINFET DEVICE WITH BURIED SIGE OXIDE

(71) Applicant: Taiwan Semiconductor Manufacturing Company, Ltd., Hsin-Chu (TW)

(72) Inventors: Kuo-Cheng Ching, Hsinchu County (TW); Chih-Hao Wang, Hsinchu County (TW); Zhiqiang Wu, Hsinchu County (TW); Carlos H Diaz, Mountain View, CA (US)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 0 days.

(21) Appl. No.: 15/401,867

(22) Filed: Jan. 9, 2017

(65) Prior Publication Data
US 2017/0117391 A1    Apr. 27, 2017

Related U.S. Application Data

(62) Division of application No. 14/090,072, filed on Nov. 26, 2013, now Pat. No. 9,559,191.

(51) Int. Cl.
*H01L 29/66* (2006.01)
*H01L 29/51* (2006.01)
(Continued)

(52) U.S. Cl.
CPC .. *H01L 29/66818* (2013.01); *H01L 21/02236* (2013.01); *H01L 21/02255* (2013.01);
(Continued)

(58) Field of Classification Search
CPC ......... H01L 29/42364; H01L 29/42392; H01L 29/66553; H01L 29/785
See application file for complete search history.

(56) References Cited

U.S. PATENT DOCUMENTS

| 7,067,868 B2 | 6/2006 | Thean et al. |
| 7,297,600 B2 * | 11/2007 | Oh .................... H01L 29/66553 |
| | | 257/E21.442 |

(Continued)

*Primary Examiner* — Kenneth Parker
*Assistant Examiner* — Fang-Xing Jiang
(74) *Attorney, Agent, or Firm* — Haynes and Boone, LLP

(57) ABSTRACT

A method includes forming isolation features on a substrate, thereby defining an active region on the semiconductor substrate; recessing the active region to form a fin trench; forming a fin feature on the fin trench by growing a first semiconductor layer on the substrate and a second semiconductor layer on the first semiconductor layer; performing a first recessing process; forming a dummy gate stack over the fin feature and the isolation feature; performing a thermal oxidation process to selectively oxidize the first semiconductor layer to form a semiconductor oxide feature on sidewalls of the first semiconductor layer; performing a second recessing process such that a portion of the isolation feature is recessed to below the second semiconductor layer, resulting in a dented void overlying the semiconductor oxide feature and underlying the second semiconductor layer; and forming a gate stack including a gate dielectric layer extending to the dented void.

20 Claims, 13 Drawing Sheets

(51) Int. Cl.
  *H01L 29/423* (2006.01)
  *H01L 29/78* (2006.01)
  *H01L 29/10* (2006.01)
  *H01L 21/02* (2006.01)
  *H01L 21/225* (2006.01)
  *H01L 21/28* (2006.01)

(52) U.S. Cl.
  CPC ...... *H01L 21/2255* (2013.01); *H01L 29/1054* (2013.01); *H01L 29/42364* (2013.01); *H01L 29/517* (2013.01); *H01L 29/66795* (2013.01); *H01L 29/66803* (2013.01); *H01L 29/785* (2013.01); *H01L 29/7849* (2013.01); *H01L 21/28167* (2013.01)

(56) References Cited

U.S. PATENT DOCUMENTS

| | | |
|---|---|---|
| 7,449,733 B2 * | 11/2008 | Inaba ................ H01L 29/42392 257/250 |
| 7,485,520 B2 | 2/2009 | Zhu et al. |
| 7,564,081 B2 | 7/2009 | Wojciechowicz et al. |
| 8,901,604 B2 | 12/2014 | Mishra et al. |
| 8,962,400 B2 | 2/2015 | Tsai et al. |
| 9,006,786 B2 | 4/2015 | Ching et al. |
| 9,209,303 B2 | 12/2015 | Ching et al. |
| 9,240,483 B2 | 1/2016 | Lee et al. |
| 9,306,069 B2 | 4/2016 | Ching et al. |
| 9,318,606 B2 | 4/2016 | Wang et al. |
| 9,634,127 B2 * | 4/2017 | Ching ................... H01L 29/785 |
| 2005/0077553 A1 | 4/2005 | Kim et al. |
| 2015/0303305 A1 | 10/2015 | Ching et al. |

* cited by examiner

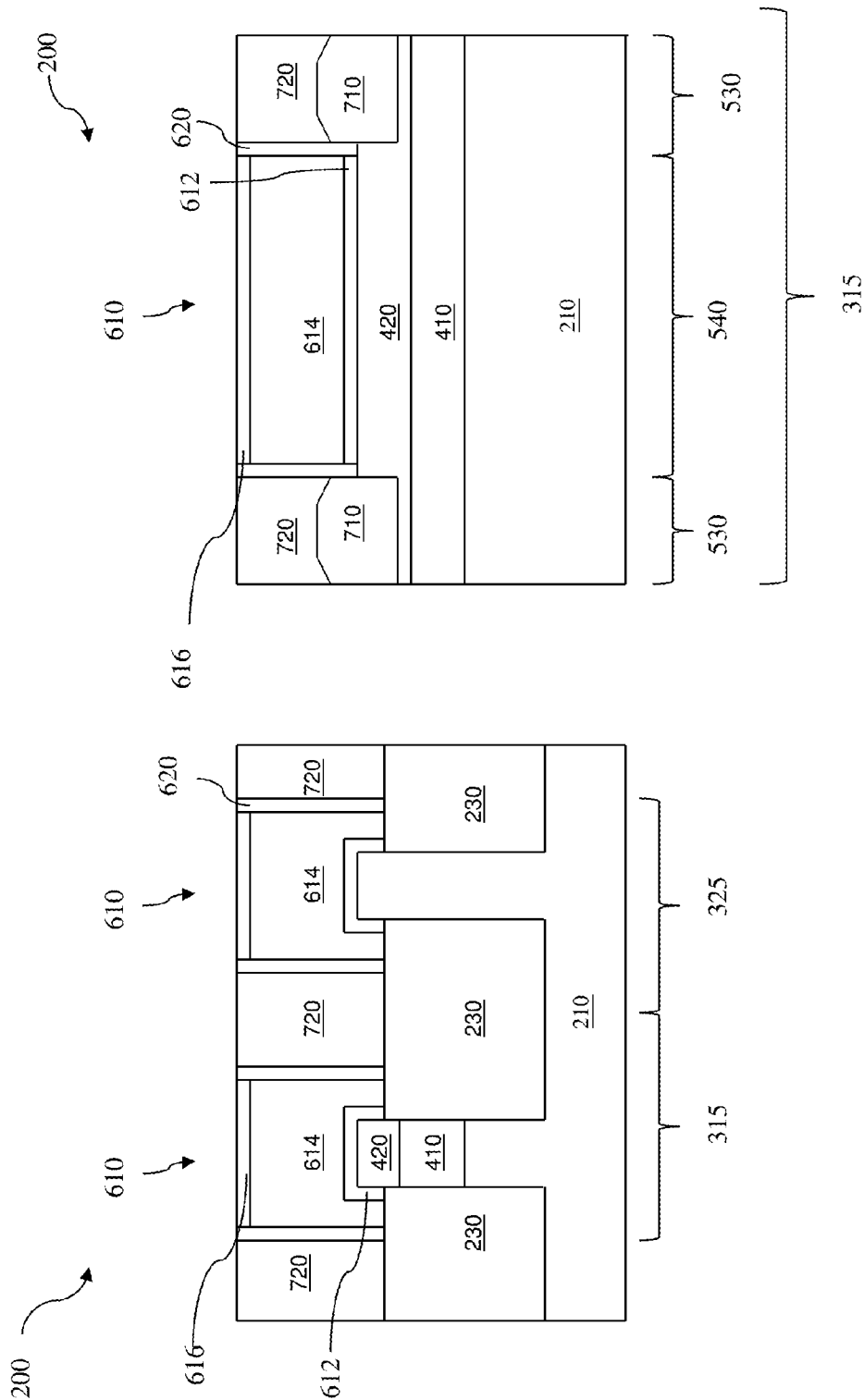

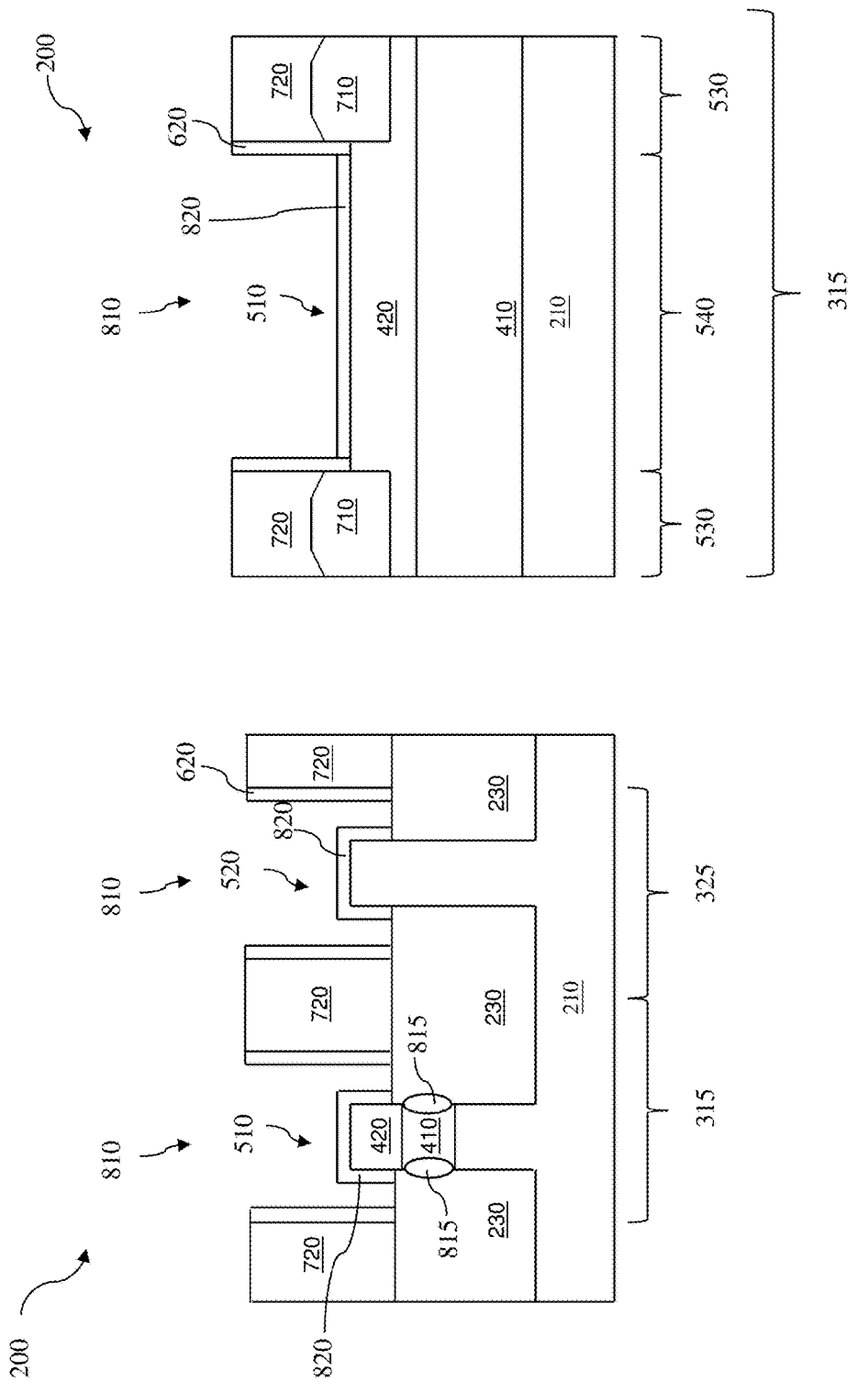

US 9,882,032 B2

STRUCTURE AND METHOD FOR FINFET DEVICE WITH BURIED SIGE OXIDE

This application is a Divisional of U.S. patent application Ser. No. 14/090,072, filed Nov. 26, 2013, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Furthermore, epitaxy growth, such as silicon germanium, is also introduced to transistors. Although existing FinFET devices and methods of fabricating FinFET devices have been generally adequate for their intended purposes, they have not been entirely satisfactory in all respects. For example, transistor leakage is found due to germanium migration. What is needed is the structure and method for FinFET device to address the above issue.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8A, 9A, 10A, 11A, and 12A are cross-sectional views of a FinFET device along line A-A in FIG. 7 at various fabrication stages constructed according to the method of FIG. 1.

FIGS. 8B, 9B, 10B, 11B and 12B are cross-sectional views of a FinFET device along line B-B in FIG. 7 at various fabrication stages constructed according to the method of FIG. 1.

DETAILED DESCRIPTION

Figure 1:
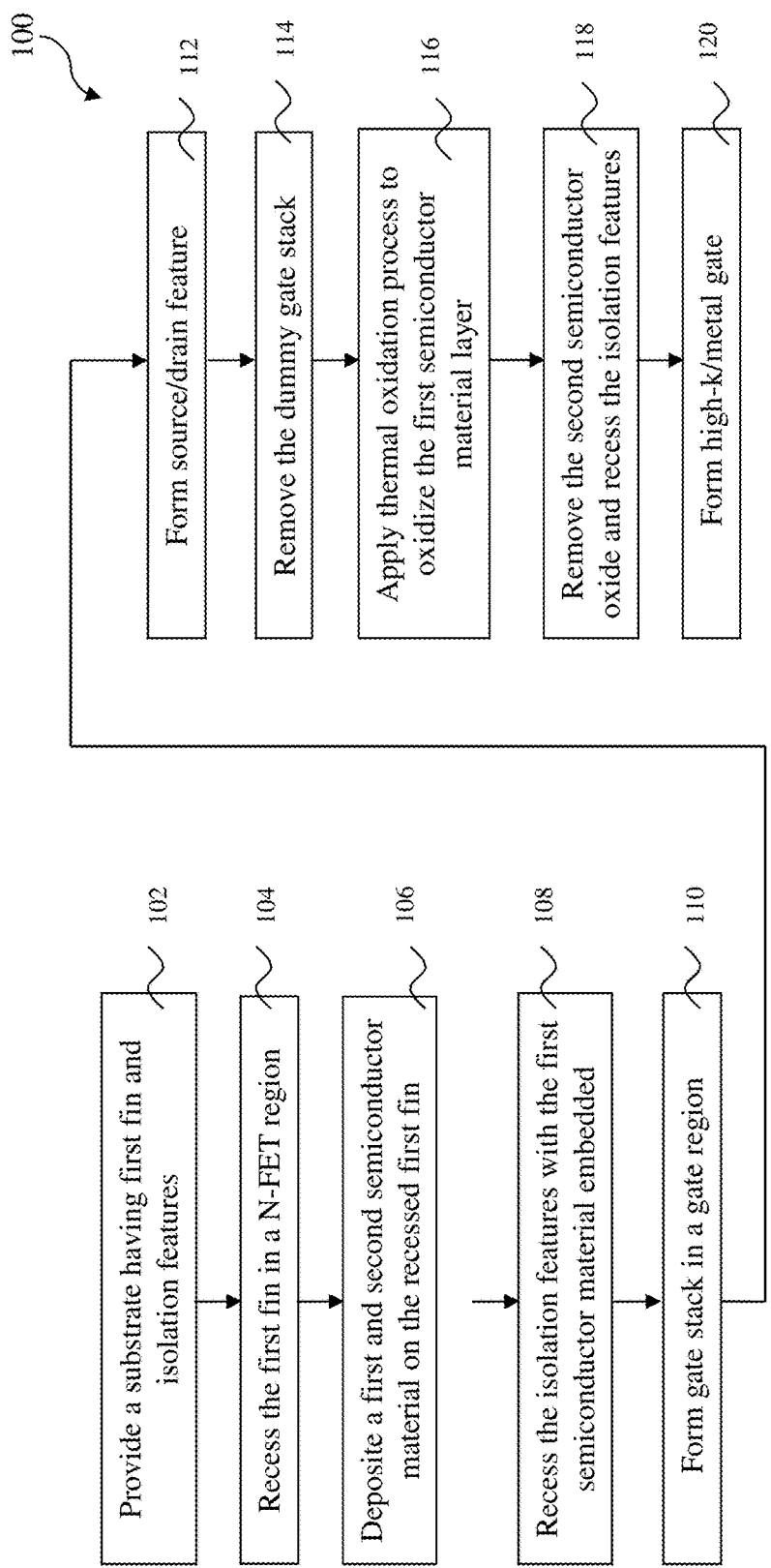
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 2:
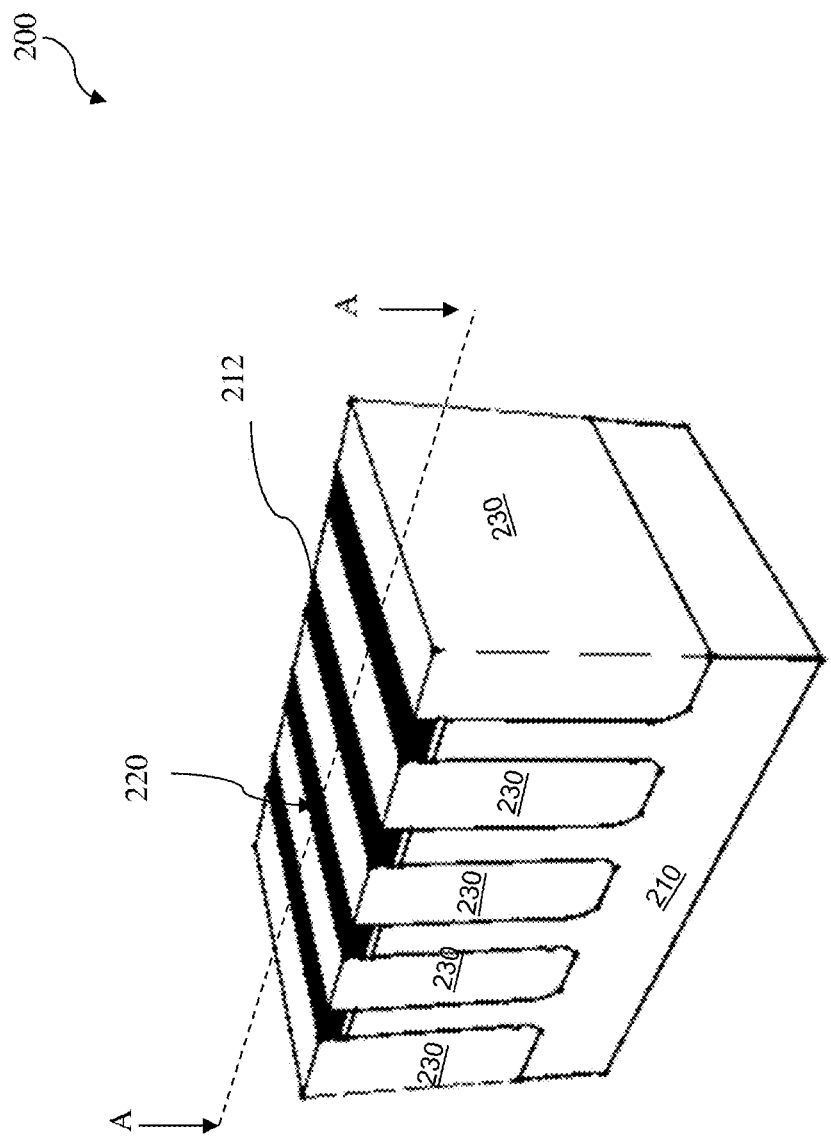
FIG. 2 is a diagrammatic perspective view of a FinFET device undergoing processes according to an embodiment of the present disclosure.

FIG. 1 is a flowchart of a method 100 for fabricating a semiconductor structure (particularly including a FinFET structure having one or more FinFET devices) 200 according to aspects of the present disclosure. FIGS. 2 and 7 are side-perspective views of the semiconductor structure 200 manufactured according to the method 100. FIGS. 3 to 6 are cross-section views of the semiconductor structure 200 at fabrication stages constructed according to the method 100. FIGS. 8A, 9A, 10A, 11A, and 12A are cross section views of the semiconductor structure 200 along the line A-A of FIG. 7. FIGS. 8B, 9B, 10B, 11B and 12B are cross section views of the semiconductor structure 200 along the line B-B of FIG. 7, wherein the line B-B is perpendicular to the direction of the line of A-A. It is understood that additional steps may be implemented before, during, and after the method, and some of the steps described may be replaced or eliminated for other embodiments of the method. The semiconductor structure 200 and the method 100 making the same are collectively described with reference to various figures.

Figure 3:
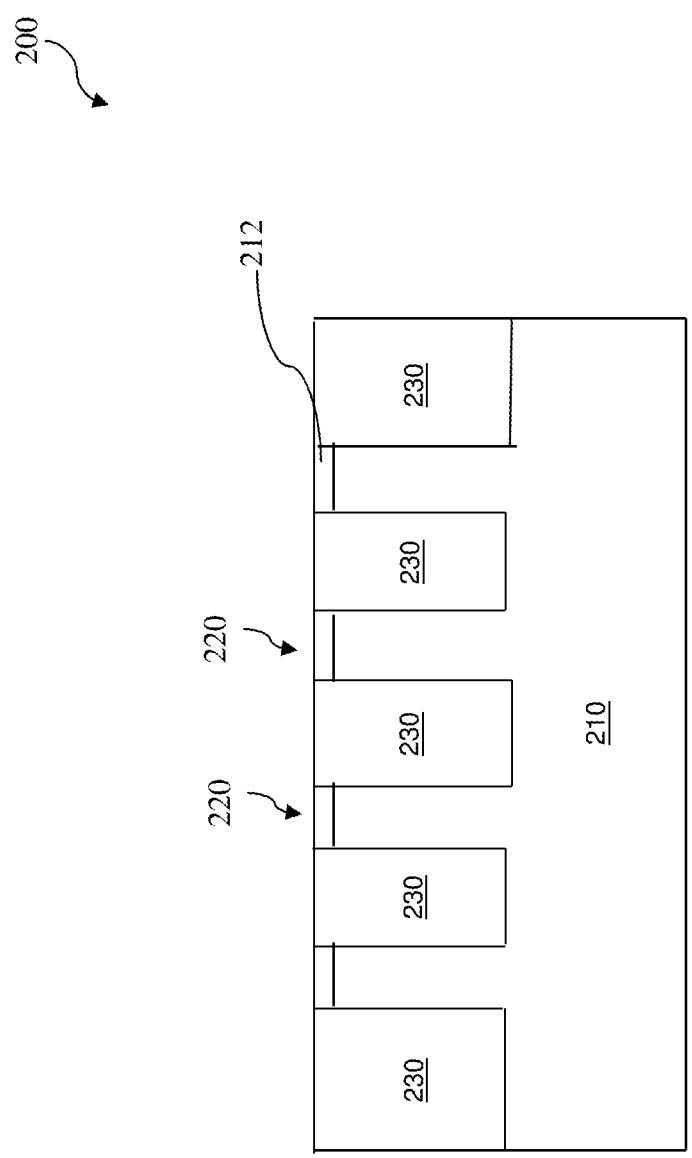
FIGS. 3 to 6 are cross-sectional views of an example FinFET device at fabrication stages constructed according to the method of FIG. 1.

Referring to FIGS. 1 and 2-3, the method 100 begins at operation 102 by providing a substrate 210. In the present embodiment, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

The substrate 210 may include various doped features depending on design requirements as known in the art. The doped features may be doped with p-type dopants, such as boron; n-type dopants, such as phosphorus or arsenic; or combinations thereof. The doped features may be formed by ion implantations and may include well structures, such as a P-type well, an N-type well, or both.

One or more isolation features are formed on the substrate 210, thereby defining first fin-like active regions (or first fins) 220. In the present embodiment, the isolation features 230 are shallow trench isolation (STI) features (also referred to by 230). The STI features 230 are formed by any suitable procedure including deposition, photolithography, and/or etching processes. In one embodiment, the STI features 230 are formed by a procedure including forming a first hard mask layer 212, applying an etch process to the substrate 210 through the openings of the first hard mask layer 212 to form trenches in the substrate 210, filling in the trenches with one or more dielectric material (such as silicon oxide), and performing a chemical mechanical polishing (CMP) process to remove excessive dielectric material and planarize the top surface, thereby forming the STI features 230 and defining the first fin active regions 220.

The hard mask layer 212 may be formed by depositing a material layer (such as silicon nitride), forming a patterned photoresist (resist) layer by a lithography process, and etching the material layer through the openings of the patterned photoresist layer to form the patterned hard mask layer 212. The CMP process may additionally remove the hard mask layer 212 as well. Alternatively, the hard mask layer 212 may be removed by an etch process, such as wet etch, after the CMP process.

An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

In another embodiment, the patterned photoresist layer is directly used the patterned mask layer 212 as an etch mask of the etch process to form the trenches in the substrate 210. In yet another embodiment, the patterned hard mask layer 212 includes silicon oxide, silicon nitride, silicon oxynitride, or any other suitable dielectric material. The patterned hard mask layer 212 may include a single material layer or multiple material layers. The hard mask layer 212 may be formed by thermal oxidation, chemical vapor deposition (CVD), atomic layer deposition (ALD), or any other appropriate method.

The isolation features 230 are formed on the substrate 210 in a figuration to isolate fin active regions. For example, the STI features 230 separate first fins 220 from each other. The isolation features 230 include silicon oxide, silicon nitride, silicon oxynitride, an air gap, other suitable materials, or combinations thereof.

Figure 4:
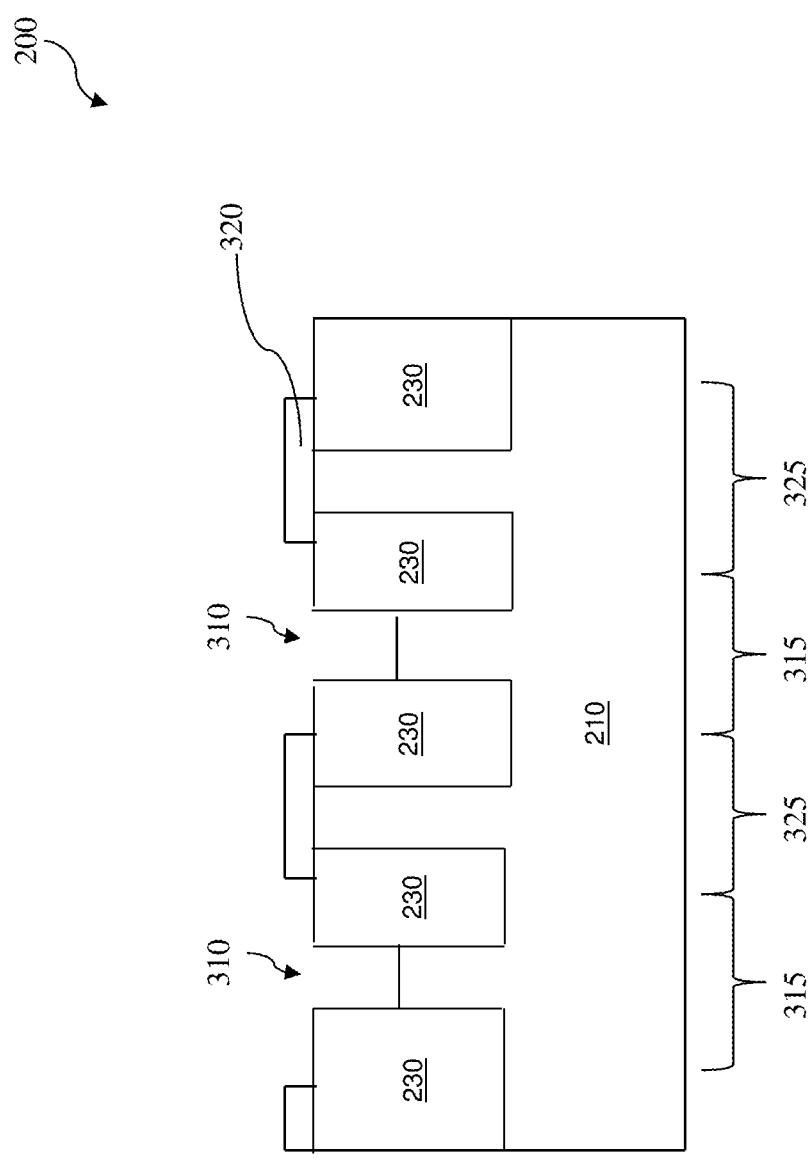

Referring to FIGS. 1 and 4, the method 100 proceeds to operation 104 by recessing the first fins 220 to form trenches 310 in an N-type FET region 315. Prior to recessing process, a second hard mask 320 is formed to protect predetermined regions, such as P-type FET region 325. Particularly, the recessing process is controlled, such as with a shorter etch duration, to achieve a moderate recessing. In one embodiment, the recessing depth ranges between about 70 nm and about 100 nm.

A formation of the second hard mask 320 is similar in many respects to the first hard mask 212 discussed above in association with FIG. 3. The recessing process may include dry etching process, wet etching process, and/or combination thereof.

The recessing process may be achieved by an etch process designed to selectively etch the semiconductor material of the semiconductor substrate 210. The recessing process may also include a selective wet etch or a selective dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

Figure 5:
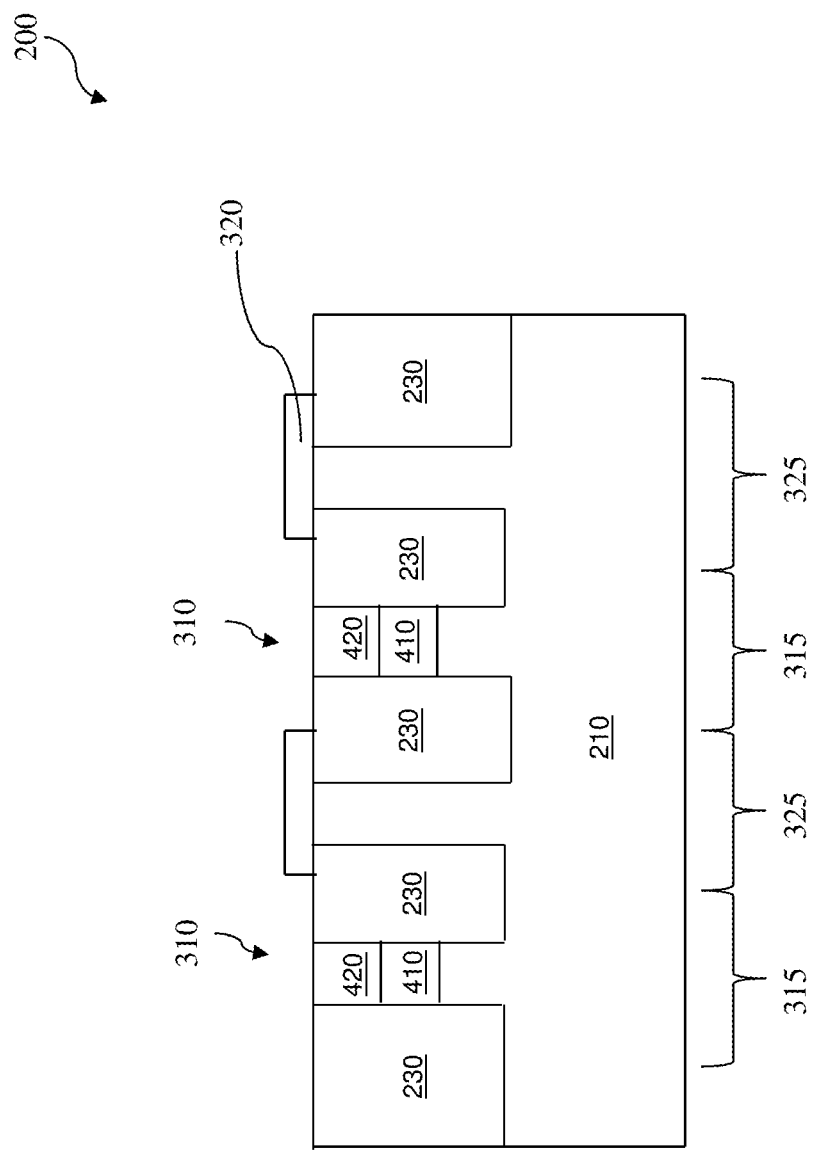

Referring to FIGS. 1 and 5, the method 100 proceeds to operation 106 by depositing a first semiconductor material layer 410 in the trenches 310 and a second semiconductor material layer 420 on top of the first semiconductor material 410. In the present embodiment, the first and second semiconductor material layers, 410 and 420, are deposited by selective epitaxial growth. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

The first and second semiconductor material layers, 410 and 420, are different from each other. The first semiconductor material layer 410 has a first lattice constant and the second semiconductor material layer 420 has a second lattice constant different from the first lattice constant. In the present embodiment, the first semiconductor material layer 410 includes silicon germanium (SiGe), and the second semiconductor material layer 420 includes silicon having a second lattice constant less than that of the first semiconductor material layer 410. In various examples, the first and second semiconductor material layers, 410 and 420, may include germanium (Ge), silicon (Si), gallium arsenide (GaAs), aluminum gallium arsenide (AlGaAs), silicon germanium (SiGe), gallium arsenide phosphide (GaAsP), or other suitable materials. Additionally, a CMP process may be performed to remove excessive semiconductor material layers (410 and 420), and planarize top surface of the semiconductor structure 200. In one example, the first semiconductor material layer 410 has a thickness ranging between about 35 nm and about 40 nm.

Figure 6:
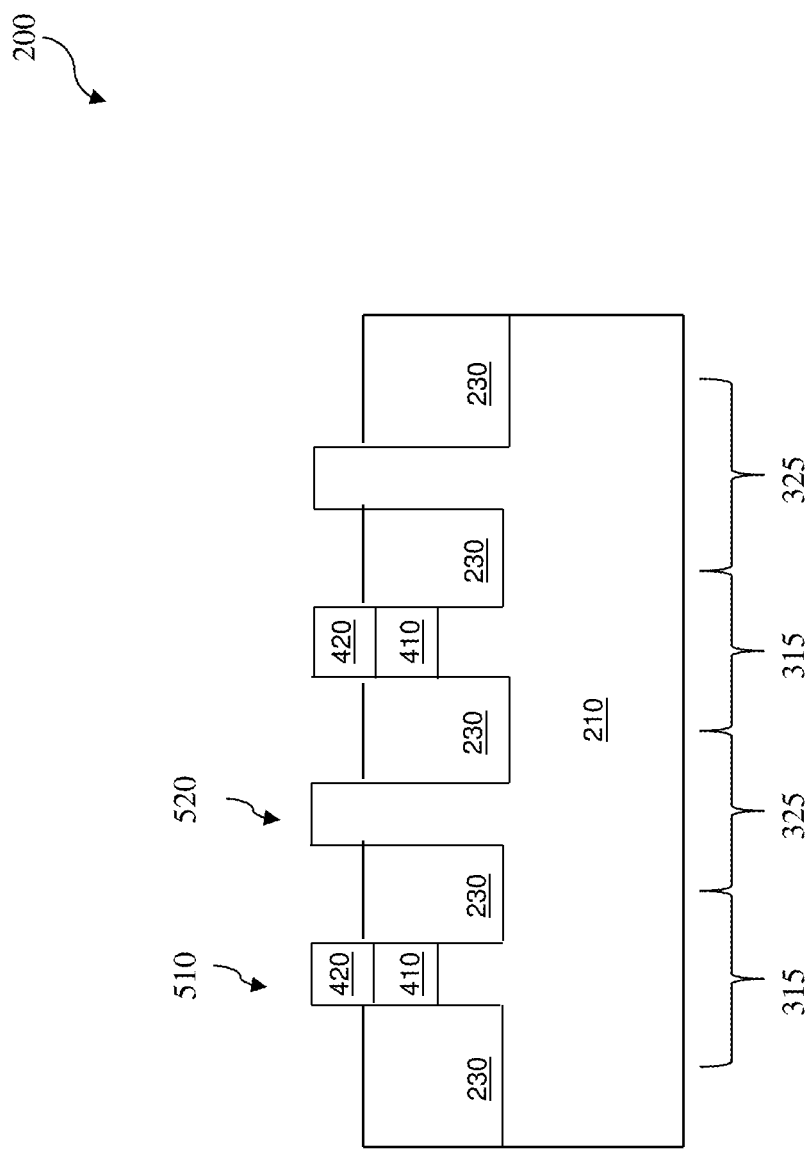
Figure 7:
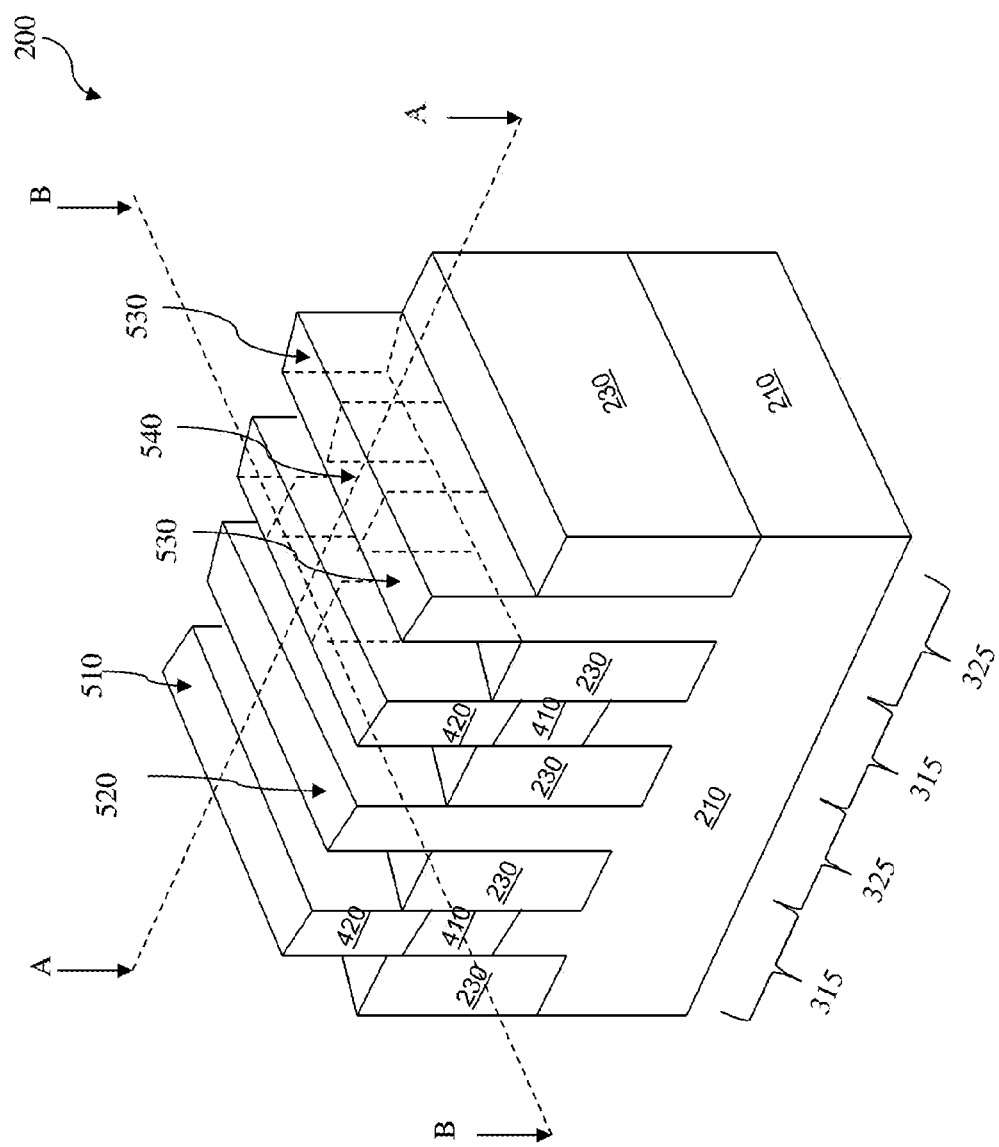
FIG. 7 is a diagrammatic perspective view of a FinFET device undergoing processes according to an embodiment of the present disclosure.

Referring to FIGS. 1 and 6, the method 100 proceeds to operation 108 by recessing the isolation features 230 around the second semiconductor material layer 420 to laterally expose an upper portion of the second semiconductor material layer 420, thereby forming second fins 510 in the N-type FET region 315 and additionally third fins 520 in the P-type FET region 325. In the present embodiment, the second fin 510 is formed as a stack of layers, 420, 410 and 210 (in an order from top to bottom). The third fin 520 may be formed by the substrate material 210. The recessing process may include dry etching process, wet etching process, and/or combination thereof. In the present embodiment, the recessing depth is controlled such that the second semiconductor layer 420 is substantially exposed but the first semiconductor layer 410 remains embedded in the recessed isolation features 230. In one example, the top surface of the first semiconductor layer 410 is below the top surface of the recessed isolation features 230 by a vertical dimension ranging between about 3 nm and about 10 nm.

The second fins 510 include a first portion extended from the semiconductor substrate 210, a second portion 410 formed on the first portion and a third portion 420 disposed on the second portion. In the present embodiment, the third portion 420 includes the same semiconductor material (such as silicon) with a first lattice constant and the second portion 410 includes a second semiconductor material (such as silicon germanium) with a second lattice constant different from the first lattice constant.

Referring to FIG. 7, in some embodiments, the second and third fins 510 and 520 each include source/drain regions 530 and a gate region 540. In furtherance of the embodiment, one of the source/drain regions 530 is a source region, and another of the source/drain regions 530 is a drain region. The source/drain regions 530 are separated by the gate region 540.

Referring to FIGS. 1 and 8A-8B, the method 100 proceeds to operation 110 by forming a gate stack 610 and sidewall spacers 620 on sidewalls of the gate stack 610. In one embodiment using a gate-last process, the gate stack 610 is a dummy gate and will be replaced by the final gate stack at a subsequent stage. Particularly, the dummy gate stacks 610 are to be replaced later by a high-k dielectric layer (HK) and metal gate electrode (MG) after high thermal temperature processes, such as thermal annealing for source/drain activation during the sources/drains formation. The dummy gate stack 610 is formed on the substrate 210 and is partially disposed over a portion of the second and third fins, 510 and 520. In one embodiment, the dummy gate stack 610 includes a dielectric layer 612, an electrode layer 614 and a third hard mask 616. The dummy gate stack 610 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 612 includes silicon oxide. Alternatively or additionally, the dielectric layer 612 may include silicon nitride, a high-k dielectric material or other suitable material. The electrode layer 614 may include polycrystalline silicon (polysilicon). The third hard mask 616 includes a suitable dielectric material, such as silicon nitride, silicon oxynitride or silicon carbide.

The sidewall spacers 620 may include a dielectric material such as silicon oxide, silicon nitride, silicon carbide, silicon oxynitride, or combinations thereof. The sidewall spacers 620 may include a multiple layers. Typical formation methods for the sidewall spacers 620 include depositing a dielectric material over the gate stack 610 and then anisotropically etching back the dielectric material. The etching back process may include a multiple-step etching to gain etch selectivity, flexibility and desired overetch control.

Referring again to FIGS. 1 and 8A-8B, the method 100 also includes an operation 112 by forming source/drain features 710 in the source/drain regions 530. The source/drain features 710 may be formed by recessing a portion of the second and third fins, 510 and 520, in the source/drain regions 530 to form source/drain recessing trenches and epitaxially growing a third semiconductor material layer in the sources/drains recessing trenches. The third semiconductor material layer includes Ge, Si, GaAs, AlGaAs, SiGe, GaAsP, or other suitable material. The source/drain features 710 may be formed by one or more epitaxy or epitaxial (epi) processes. The source/drain features 710 may be in-situ doped during the epi process. For example, the epitaxially grown SiGe source/drain features 710 may be doped with boron; and the epitaxially grown Si epi source/drain features 710 may be doped with carbon to form Si:C source/drain features, phosphorous to form Si:P source/drain features, or both carbon and phosphorous to form SiCP source/drain features. In one embodiment, the source/drain features 710 are not in-situ doped, an implantation process (i.e., a junction implant process) is performed to dope the source/drain features 710. Additionally, an interlayer dielectric (ILD) layer 720 is formed on the substrate 210 between the gaps of the dummy gate stacks 610. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the semiconductor structure 200.

The operations 110 and 112 may be implemented collectively in one procedure to form dummy gate stacks 610 and the source/drain features 710. One embodiment of the procedure is described below. The dummy gate stacks 610 are first formed by deposition and patterning. For example, the dielectric layer 612 includes silicon oxide and is formed by a suitable technique, such as in-situ steam growth (ISSG). The electrode layer 614 includes polysilicon and is deposited by a suitable technique, such as CVD. A hard mask layer 616 includes a suitable dielectric material (such as silicon nitride) and is deposited by a suitable technique, such as CVD. Then the hard mask layer 616 is patterned by a lithography process and an etch process, thereby forming various openings in the hard mask layer, exposing the underlying dummy gate materials within the openings. Another etch process is applied to the dummy gate materials through the openings of the hard mask layer using the hard mask as an etch mask, thereby forming the gate stacks 610. Thereafter, an etch process is applied to recess a portion of the second and third fins, 510 and 520, in the source/drain regions 530 to form source/drain recessing trenches and epitaxially growing a third semiconductor material layer in the sources/drains recessing trenches. A first ion implantation process with a first doping dose is applied to the semiconductor structure 200, thereby forming light doped drain (LDD) features. Alternatively, LDD features are formed by in-situ doping. Spacers 620 are formed thereafter by deposition and anisotropic etch. Afterward, a second ion implantation process with a second doping dose greater than the first doping dose is applied to the semiconductor structure 200, thereby forming heavily doped source and drain features that are offset from the LDD features by the spacers 620. The LDD features and heavily doped source and drain features collectively constitute the source and drain features 710. Thereafter, the ILD layer 720 is formed by deposition and polishing (such as CMP). The hard mask layer 616 may be removed before or alternatively after the ILD formation.

Figure 9B:
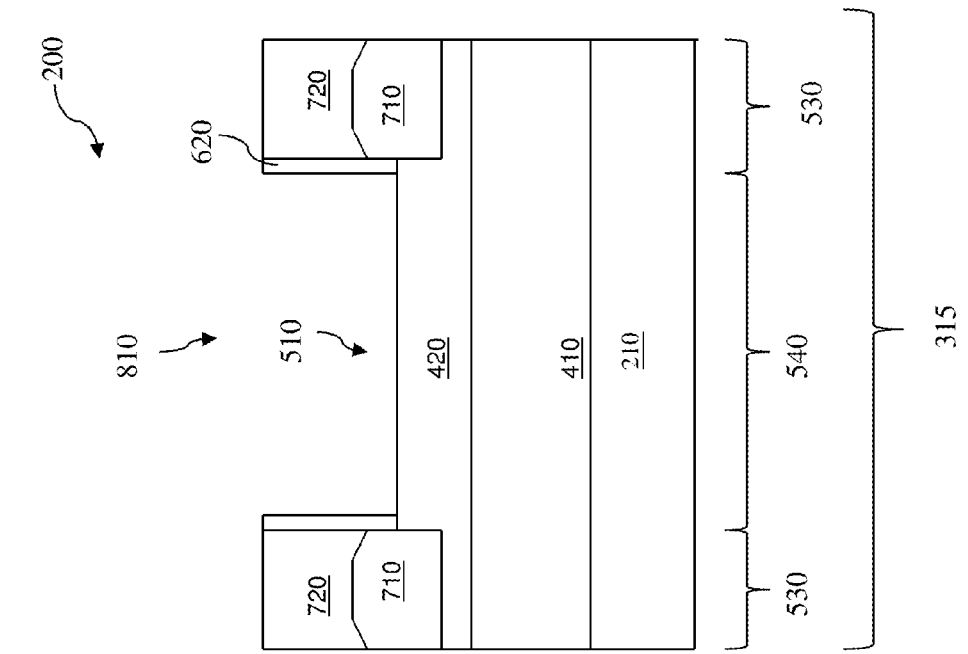
Figure 9A:
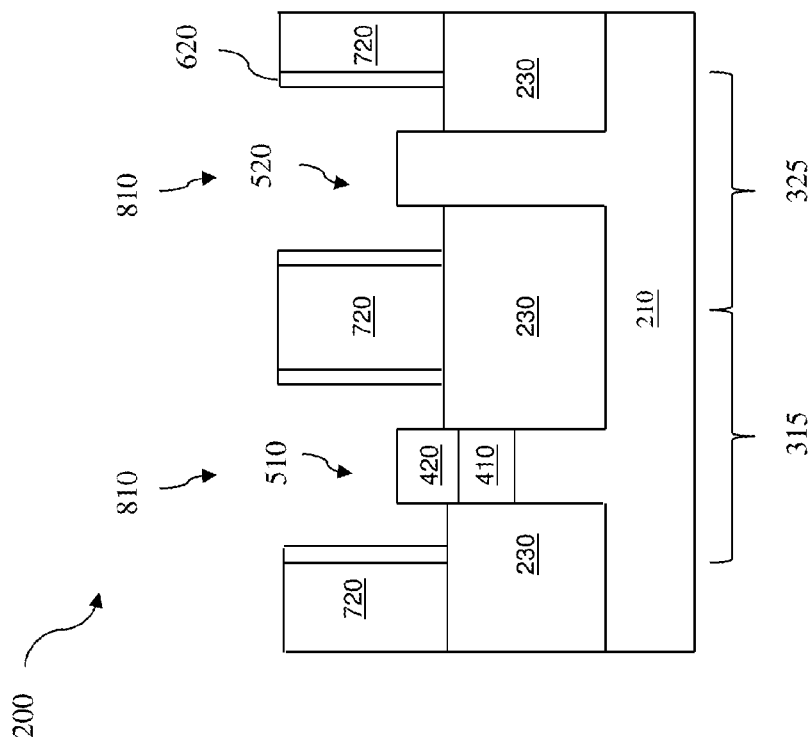

Referring to FIGS. 1 and 9A-9B, the method 100 proceeds to operation 114 by removing the dummy gate stacks 610 to form one or more gate trench 810 but the isolation features 230 in the gate trench 810 remain such that the first semiconductor material layer 410 of the second fin 510 is embedded in the isolation features 230. In other words, the top surface of the isolation features 230 is higher than the top surface of the first semiconductor material layer 410. The dummy gate stacks are removed by an etch process (such as selective wet etch or selective dry etch) designed to have an adequate etch selectivity with respect to the first and second semiconductor material layers, 410 and 420, and the sidewall spacer 620. The etch process may include one or more etch steps with respective etchants.

Referring to FIGS. 1 and 10A-10B, the method 100 proceeds to operation 116 by performing a thermal oxidation process to the semiconductor structure 200. In the present embodiment, the first semiconductor material layer 410 and the second semiconductor material layer 420 are in different environments. Particularly, the first semiconductor material layer 410 is embedded with high strain and the second semiconductor material layer 420 is exposed with no or low strain. With the differentiated conditions to the first and second semiconductor materials, the thermal oxidation process is designed and tuned with substantial selectivity to oxidize the first semiconductor material layer 410 that is unexposed. The tuning of the thermal oxidation process for selective oxidation includes tuning the thickness of the thickness of the first semiconductor material layer 410, the composition of the first semiconductor material layer 410 (such as germanium concentration), and the oxidation temperature. In one embodiment, the thermal oxidation process is conducted in oxygen ambient. In another embodiment, the thermal oxidation process is conducted in a combination of steam ambient and oxygen ambient. In the present example, the thermal oxidation process to the semiconductor structure 200 is performed in a $H_2O$ reaction gas with a temperature ranging from about 500° C. to about 600° C. and under a pressure ranging from about 1 atm. to about 20 atm.

During the thermal oxidation process, at least side portions of the second semiconductor material layer 420 in the gate trench 810 converts to semiconductor oxide features 815. Accordingly, with a volume expansion, the semiconductor oxide features 815 apply a stress to the second semiconductor material layer 420 in the second fin 510, where a transistor channel is defined underlying the gate.

In one embodiment, the first semiconductor material layer 410 includes silicon germanium (SiGex) and the second semiconductor material layer 420 includes silicon (Si). The subscript x is Ge composition in atomic percent and it may be adjusted to meet a predetermined volume expansion target. In one embodiment, x is in a range from 40% to 70%. The first semiconductor material layer 420 is partially or completely oxidized by the thermal oxidation process, thereby forming the semiconductor oxide features 815 that include silicon germanium oxide (SiGeOy) or germanium oxide (GeOy), where subscript y is oxygen composition in atomic percent. The semiconductor oxide features extend in the vertical direction from the top surface to the bottom surface of the first semiconductor material layer 410. In the present example, the semiconductor oxide features 815 extends in the vertical direction with a horizontal dimension varying from the top surface to the bottom surface of the first semiconductor material layer 410. In furtherance of the present example, the horizontal dimension of the semiconductor oxide features 815 reaches its maximum and decreases to zero when approaches to the top and bottom surfaces of the semiconductor oxide features 815, resulting in an olive shape in a cross-sectional view.

The oxidation of the first semiconductor material layer 410 builds up proper strain in the channel of the FET for mobility enhancement. During the thermal oxidation process, the exposed second semiconductor material layer 420 may be partially oxidized to a semiconductor oxide layer 820 on the exposed surface thereof.

Figure 11A:
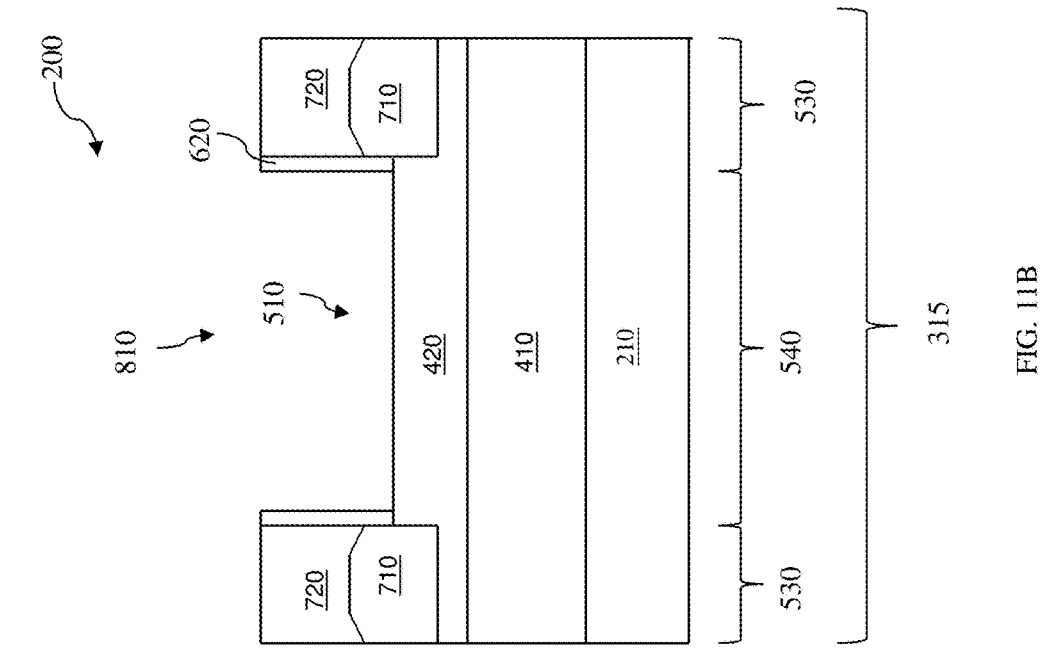
Figure 11B:
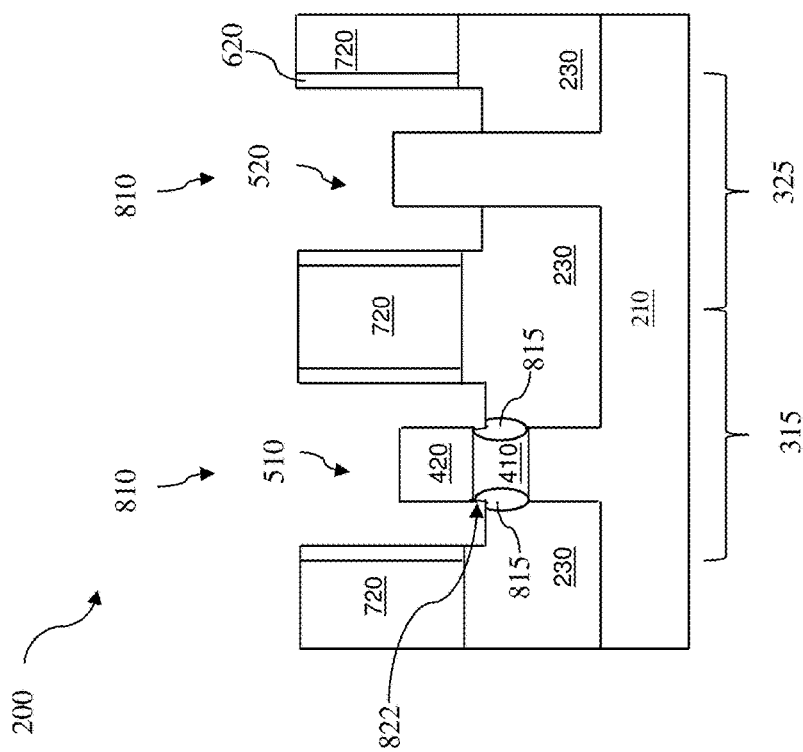

Referring to FIGS. 1 and 11A-11B, the method 100 proceeds to operation 118 to remove the semiconductor oxide layer 820 by an etch process with a suitable etchant, such as a solution including hydrofluoric acid (HF) that selectively removes oxide. During the etch process, the isolation features 230 are also recessed such that the top surface of the isolation features 230 is recessed from above the top surface of the first semiconductor material layer 410 to below the top surface of the first semiconductor material layer 410. State differently, after the recessing, the isolation feature 230 is slightly below the second semiconductor material layer 420. Accordingly, the tip portions of the semiconductor oxide features 815 are exposed. Furthermore, the etch process also removes the exposed tip portions of the semiconductor oxide features 230, resulting in dented voids 822. In one example, the dented avoid 822 extend a vertical dimension ranging from about 3 nm to about 6 nm and a horizontal dimension ranging from about 1 nm to about 4 nm.

Figure 12B:
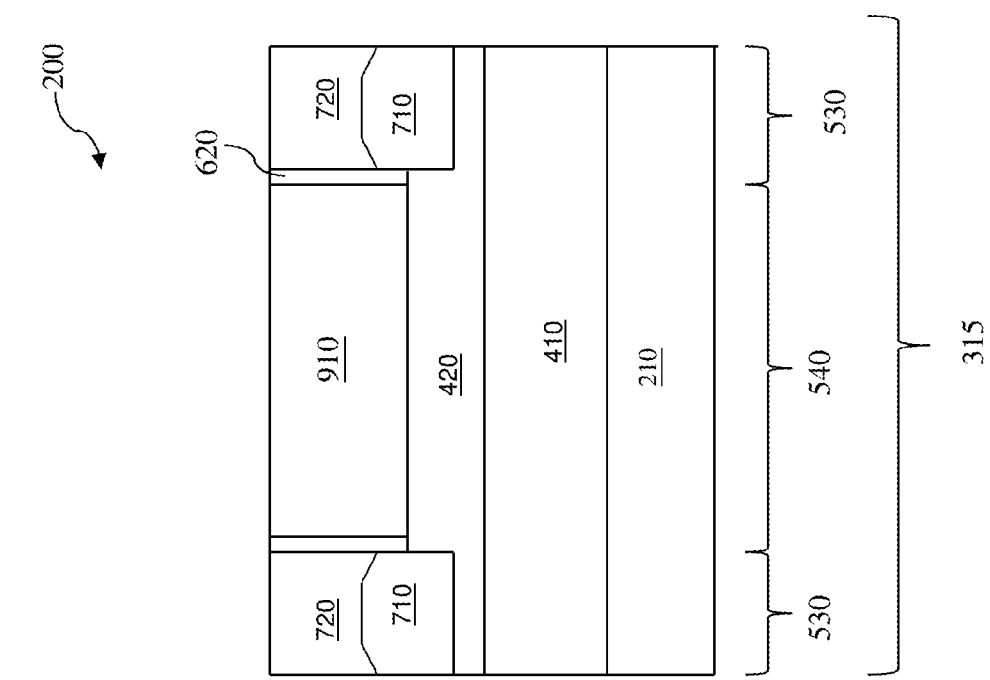
Figure 12A:
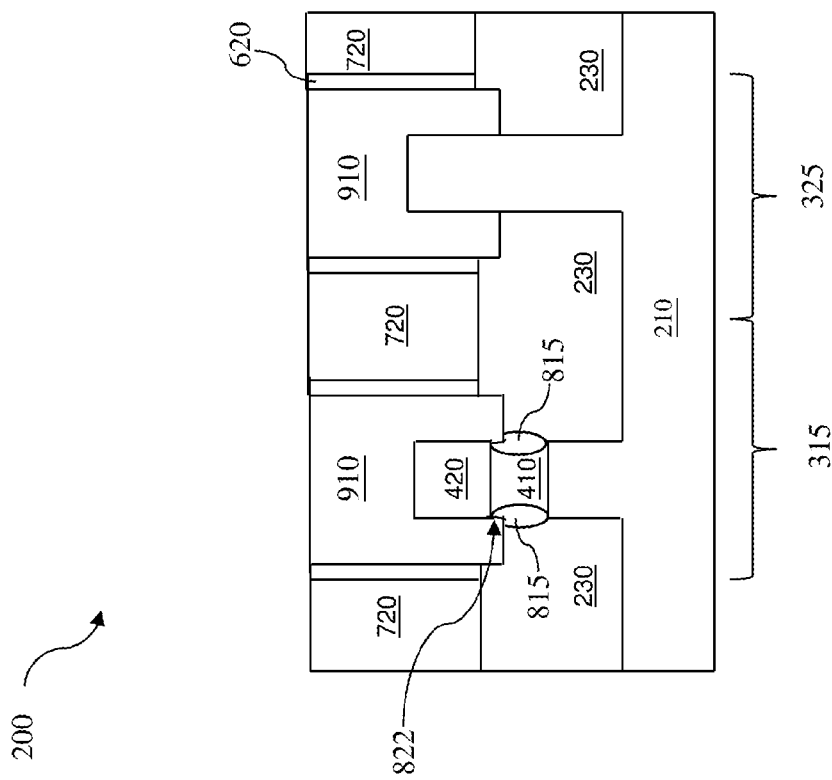

Referring to FIGS. 1 and 12A-12B, the method 100 proceeds to operation 120 by forming metal gate stacks (MG) 910 over the substrate 210, including wrapping over a portion of the second fins. The metal gate stacks 910 include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the metal gate stacks 910 includes depositions to form various gate materials and a CMP process to remove the excessive gate materials and planarize the top surface of the semiconductor structure 200.

Figures 13, 14:
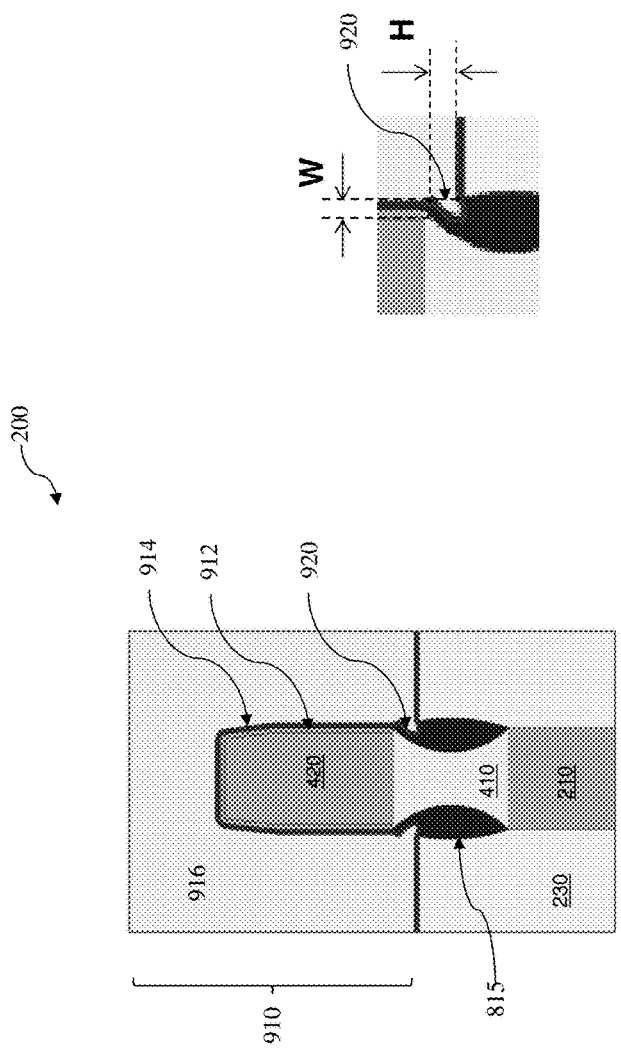
FIGS. 13 and 14 are portions of the FinFET device of FIG. 12A in details.

The semiconductor structure 200 is further illustrated in FIGS. 13 and 14, in a sectional fragmental view. Particularly, a portion of the semiconductor structure 200 is zoomed in for clarity. In embodiment, the gate dielectric layer includes an interfacial layer (IL) 912 is deposited by a suitable method, such as atomic layer deposition (ALD), CVD, thermal oxidation or ozone oxidation. The IL 912 includes oxide, HfSiO and oxynitride. A HK dielectric layer 914 is deposited on the IL 912 by a suitable technique, such as ALD, CVD, metal-organic CVD (MOCVD), physical vapor deposition (PVD), other suitable technique, or a combination thereof. The HK dielectric layer 914 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

A metal gate (MG) electrode 916 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 916 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 916 may be formed by ALD, PVD, CVD, or other suitable process. The MG electrode 916 may be formed separately for the N-FET and P-FFET with different metal layers. A CMP process may be performed to remove excessive MG electrode 916. The CMP process provides a substantially planar top surface for the metal gate electrode 916 and the ILD layer 720.

When the gate stacks 910 are formed in the gate trenches by the operation 120, the gate dielectric materials are also filled in the dented voids 822. As illustrated in FIG. 14 and other figures, the gate stacks 910 are overlying respective channel regions, each spanning from respective source to drain in a first direction. The bottom surface of the gate stacks 910 are below the top surface of the first semiconductor layer 410 since the isolation features 230 are further recessed by the operation 118.

The first semiconductor material layer 410 underlying the respective channel region is recessed from both sides spanning in a second direction perpendicular to the first direction. In the sectional view of FIG. 13, along in the second direction, the recessed first semiconductor layer 410 has the least thickness at the middle and has the greatest thickness at the top and bottom. The greater thickness is substantially equal to the thickness of the first semiconductor material layer 420. The recessed first semiconductor layer 410 is further shielded by the semiconductor oxide features 815 that have a thickness decreased to zero from the middle portion to the bottom portion. The dented voids 822 are filled with the gate dielectric material, referred to as side dielectric tips 920 that are directly on the semiconductor oxide features 815. The side dielectric tips 920 include a dielectric material different from that of the side dielectric oxide features 815. In the present embodiment, the side dielectric tips 920 include a HK dielectric material and the semiconductor oxide features 815 include silicon germanium oxide or germanium oxide.

As further illustrated in FIG. 14, the side dielectric tips 920 each extend a vertical dimension H and a horizontal dimension W. In the present example, the vertical dimension H ranges from about 1 nm to about 4 nm and the horizontal dimension W ranges from about 1 nm to about 4 nm. During the thermal oxidation process at the operation 116 and other processes, the germanium migration may decrease the resistance and induce source/drain shoot. Particularly, it leads to the leakage from the source to the drain through the tip portion of the semiconductor oxide features. By the disclosed method 100 and the semiconductor structure 200, the tip portions of the semiconductor oxide features are removed and replaced by the side dielectric tips 920 with increased isolation effect and improved transistor performance.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method. Based on the above, the present disclosure offers a semiconductor structure having a strained channel in N-FET with increase isolation effect and improved device performance.

Thus, the present disclosure provides one embodiment of a method for fabricating a semiconductor structure. The method includes forming isolation features on a semiconductor substrate, thereby defining an active region on the semiconductor substrate; recessing the active region to form a fin trench; forming a fin feature on the fin trench by a first epitaxy growing a first semiconductor layer on the semiconductor substrate within the active region and a second epitaxy growing a second semiconductor layer on the first semiconductor layer; performing a first recessing process to the isolation feature such that the first semiconductor layer is below and embedded in the isolation feature; forming a dummy gate stack over the fin feature and the isolation feature; forming source and drain on the fin feature; performing a thermal oxidation process to selectively oxidize the first semiconductor layer to form a semiconductor oxide feature on sidewalls of the first semiconductor layer; performing a second recessing process such that a portion of the isolation feature is recessed to below the second semiconductor layer, resulting in a dented void that is overlying the semiconductor oxide feature and underlying the second semiconductor layer; and forming a gate stack including a gate dielectric layer and a gate electrode, wherein the gate dielectric layer extends to and fills in the dented void.

The present disclosure also provides another embodiment of a method. The method includes forming isolation features on a semiconductor substrate, thereby defining an active region on the semiconductor substrate; recessing the active region to form a fin trench; forming a fin feature on the fin trench by a first epitaxy growing a silicon germanium layer on the semiconductor substrate within the active region and a second epitaxy growing a silicon layer on the silicon germanium layer; performing a first recessing process to the isolation feature such that the silicon germanium layer is below and embedded in the isolation feature; forming a dummy gate stack over the fin feature and the isolation feature; forming source and drain on the fin feature and interposed by the dummy gate stack; removing the dummy gate stack; performing a thermal oxidation process to selectively oxide the silicon germanium layer to form a semiconductor oxide feature of silicon geranium oxide on sidewalls of the silicon germanium layer; performing a second recessing process such that the isolation feature is recessed to below the silicon layer, resulting in a dented void that is underlying the silicon layer and overlying the semiconductor oxide feature; and forming a gate stack including a gate dielectric layer and a gate electrode, wherein the gate dielectric layer extends to and fills in the dented void, resulting a dielectric tip in the dented void.

The present disclosure also includes yet another embodiment of a method fabricating a semiconductor structure. The method includes forming an isolation feature and a fin feature on a silicon substrate, wherein fin feature is surrounded by the isolation feature and includes a silicon germanium layer on the silicon substrate and a silicon layer on the silicon germanium layer; performing a first recessing process to the isolation feature such that the silicon germanium layer is below and embedded in the isolation feature; performing a thermal oxidation process to selectively oxide the silicon germanium layer to form a semiconductor oxide feature of silicon geranium oxide on sidewalls of the silicon germanium layer; performing a second recessing process such that the isolation feature is recessed to below the silicon layer, resulting in a dented void that is underlying the silicon layer and overlying the semiconductor oxide feature; and forming a gate stack including a gate dielectric layer and a gate electrode, wherein the gate dielectric layer extends to and fills in the dented void, resulting a dielectric tip in the dented void.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming isolation features on a semiconductor substrate, thereby defining an active region on the semiconductor substrate;
    recessing the active region to form a fin trench;
    forming a fin feature on the fin trench by a first epitaxy growing a first semiconductor layer on the semiconductor substrate within the active region and a second epitaxy growing a second semiconductor layer on the first semiconductor layer;
    performing a first recessing process to the isolation feature such that the first semiconductor layer is below and embedded in the isolation feature;
    forming a dummy gate stack over the fin feature and the isolation feature;
    forming source and drain on the fin feature;
    performing a thermal oxidation process to selectively oxidize the first semiconductor layer to form a semiconductor oxide feature on sidewalls of the first semiconductor layer;
    performing a second recessing process such that a portion of the isolation feature is recessed to below the second semiconductor layer, resulting in a dented void that is overlying the semiconductor oxide feature and underlying the second semiconductor layer; and
    forming a gate stack including a gate dielectric layer and a gate electrode, wherein the gate dielectric layer extends to and fills in the dented void.

2. The method of claim 1, wherein
    the first epitaxy growing of the first semiconductor layer on the semiconductor substrate includes epitaxy growing silicon germanium; and
    the second epitaxy growing of the second semiconductor layer includes epitaxy growing silicon.

3. The method of claim 2, wherein the performing of the thermal oxidation process includes selectively oxidizing the silicon germanium to form the semiconductor oxide feature of silicon germanium oxide.

4. The method of claim 1, wherein the forming of the gate stack includes forming the gate dielectric layer of a high k dielectric material.

5. The method of claim 1, further comprising removing the dummy gate after the forming of the source and drain on the fin feature and before the performing of the thermal oxidation process.

6. The method of claim 1, wherein the forming of the source and drain on the fin feature includes:
    recessing the fin feature within source and drain regions; and
    epitaxially growing a third semiconductor material layer within the source and drain regions.

7. The method of claim 6, wherein the epitaxially growing of the third semiconductor material layer includes epitaxially growing a semiconductor material selected from the group consisting of Ge, Si, GaAs, AlGaAs, SiGe, and GaAsP.

8. The method of claim 6, wherein the epitaxially growing of the third semiconductor material layer includes epitaxially growing silicon doped with carbon and phosphorous to form SiCP source and drain.

9. The method of claim 1, wherein the performing of the thermal oxidation process includes the thermal oxidation process in a $H_2O$ reaction gas with a temperature ranging from about 500° C. to about 600° C. and under a pressure ranging from about 1 atm. to about 20 atm.

10. The method of claim 1, wherein the forming of the gate stack includes for a dielectric tip in the dented void, wherein the dielectric tip includes a high k dielectric material.

11. The method of claim 10, wherein the dielectric tip includes a dielectric material selected from the group consisting of LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, and oxynitrides (SiON).

12. A method, comprising:
    forming isolation features on a semiconductor substrate, thereby defining an active region on the semiconductor substrate;
    recessing the active region to form a fin trench;
    forming a fin feature on the fin trench by a first epitaxy growing a silicon germanium layer on the semiconductor substrate within the active region and a second epitaxy growing a silicon layer on the silicon germanium layer;
    performing a first recessing process to the isolation feature such that the silicon germanium layer is below and embedded in the isolation feature;
    forming a dummy gate stack over the fin feature and the isolation feature;
    forming source and drain on the fin feature and interposed by the dummy gate stack;
    removing the dummy gate stack;
    performing a thermal oxidation process to selectively oxide the silicon germanium layer to form a semiconductor oxide feature of silicon geranium oxide on sidewalls of the silicon germanium layer;
    performing a second recessing process such that the isolation feature is recessed to below the silicon layer, resulting in a dented void that is underlying the silicon layer and overlying the semiconductor oxide feature; and
    forming a gate stack including a gate dielectric layer and a gate electrode, wherein the gate dielectric layer extends to and fills in the dented void, resulting a dielectric tip in the dented void.

13. The method of claim 12, wherein the forming of the gate stack includes:
    forming the gate dielectric layer of a high k dielectric material and the dielectric tip of the high k dielectric material; and
    forming the gate electrode of a metal-containing conductive material.

14. The method of claim 13, wherein
the high k dielectric material includes a dielectric material selected from the group consisting of LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, and oxynitrides (SiON); and
the metal-containing conductive material include one material selected from the group consisting of Ti, Ag, Al, TiAlN, TaC, TaCN, TaSiN, Mn, Zr, TiN, TaN, Ru, Mo, Al, WN, Cu, W, and a combination thereof.

15. The method of claim 12, wherein the forming of the source and drain on the fin feature includes:
recessing the fin feature within source and drain regions; and
epitaxially growing, within source and drain regions, a semiconductor material selected from the group consisting of Ge, Si, GaAs, AlGaAs, SiGe, and GaAsP.

16. The method of claim 15, wherein the epitaxially growing of the semiconductor material includes epitaxially growing silicon doped with carbon and phosphorous to form SiCP source and drain.

17. The method of claim 12, wherein the performing of the thermal oxidation process includes the thermal oxidation process in a H$_2$O reaction gas with a temperature ranging from about 500° C. to about 600° C.

18. A method, comprising:
forming an isolation feature and a fin feature on a silicon substrate, wherein fin feature is surrounded by the isolation feature and includes a silicon germanium layer on the silicon substrate and a silicon layer on the silicon germanium layer;
performing a first recessing process to the isolation feature such that the silicon germanium layer is below and embedded in the isolation feature;
performing a thermal oxidation process to selectively oxide the silicon germanium layer to form a semiconductor oxide feature of silicon geranium oxide on sidewalls of the silicon germanium layer;
performing a second recessing process such that the isolation feature is recessed to below the silicon layer, resulting in a dented void that is underlying the silicon layer and overlying the semiconductor oxide feature; and
forming a gate stack including a gate dielectric layer and a gate electrode, wherein the gate dielectric layer extends to and fills in the dented void, resulting a dielectric tip in the dented void.

19. The method of claim 18, further comprising:
recessing the fin feature within source and drain regions; and
epitaxially growing silicon doped with carbon and phosphorous to form SiCP source and drain.

20. The method of claim 18, wherein the performing of the thermal oxidation process includes the thermal oxidation process in a H$_2$O reaction gas with a temperature ranging from about 500° C. to about 600° C. and under a pressure ranging from about 1 atm. to about 20 atm.

* * * * *